(12) United States Patent
Teramoto

(10) Patent No.: US 12,593,391 B2
(45) Date of Patent: Mar. 31, 2026

(54) LIGHT SOURCE APPARATUS

(71) Applicant: Ushio Denki Kabushiki Kaisha, Tokyo (JP)

(72) Inventor: Yusuke Teramoto, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 712 days.

(21) Appl. No.: 17/899,772

(22) Filed: Aug. 31, 2022

(65) Prior Publication Data

US 2023/0319970 A1 Oct. 5, 2023

(30) Foreign Application Priority Data

Mar. 30, 2022 (JP) ................................. 2022-057606

(51) Int. Cl.
*H05G 2/00* (2006.01)
*H01J 37/32* (2006.01)
(52) U.S. Cl.
CPC .......... *H05G 2/002* (2024.08); *H01J 37/3244* (2013.01)
(58) Field of Classification Search
CPC ........ H05G 2/003; H05G 2/005; H05G 2/008; H05G 2/0035; H01J 37/3244; H01S 3/101; H01S 3/136
See application file for complete search history.

(56) References Cited

U.S. PATENT DOCUMENTS

| | | | |
|---|---|---|---|
| 7,622,727 B2 | 11/2009 | Shirai et al. | |
| 10,672,584 B2 | 6/2020 | Teramoto et al. | |

| | | | | |
|---|---|---|---|---|
| 2017/0094766 A1* | 3/2017 | Yokoyama | .............. | H01S 3/136 |
| 2020/0060014 A1* | 2/2020 | Vinokhodov | ........ | H05G 2/0094 |
| 2021/0327701 A1* | 10/2021 | Ashizawa | ............... | H01J 61/06 |

FOREIGN PATENT DOCUMENTS

| | | | |
|---|---|---|---|
| JP | 6658324 B2 | 12/2017 | |

OTHER PUBLICATIONS

Unpublished, Pending U.S. Appl. No. 18/096,452, filed Jan. 12, 2023 by Yusuke Teramoto, Related to the Current Application.
Extended European Search Report of Jun. 13, 2023 for European Application No. EP22194063, which corresponds to the current U.S. Appl. No. 17/899,772.

* cited by examiner

*Primary Examiner* — David E Smith
*Assistant Examiner* — Hsien C Tsai
(74) *Attorney, Agent, or Firm* — Yoshida & Associates LLC; Kenichiro Yoshida

(57) ABSTRACT

A light source apparatus, in which an energy beam transforms a liquid raw material into plasma to extract radiation, includes a rotation body, a raw material supply section, and an electric field applying section. The rotation body is disposed at a position onto which the energy beam is incident. The raw material supply section supplies the liquid raw material to the rotation body. The electric field applying section is set to a potential different from a potential of the liquid raw material that has been supplied to the rotation body, and applies an electric field to a plasma generation area in which plasma is to be generated by irradiation of the energy beam.

21 Claims, 5 Drawing Sheets

LIGHT SOURCE APPARATUS

CROSS-REFERENCE TO RELATED APPLICATION(S)

This application claims priority from Japanese Priority Patent Application No. 2022-057606 filed Mar. 30, 2022. The entire teachings of the above application are incorporated herein by reference.

BACKGROUND ART

The present invention relates to a light source apparatus applicable to the emission of X-rays, extreme ultraviolet light, or the like.

X-rays have been conventionally used for medical, industrial, and research applications. In the medical field, X-rays are used for such applications as chest radiography, dental radiography, and computed tomography (CT). In the industrial field, X-rays are used for such applications as non-destructive testing and tomographic non-destructive testing to observe the inside of materials such as structures and welds. In the research field, X-rays are used for such applications as X-ray diffraction to analyze the crystal structure of materials and X-ray spectroscopy (X-ray fluorescence analysis) to analyze the constituent composition of materials.

X-rays can be generated using an X-ray tube, in which a pair of electrodes (anode and cathode) are provided. When a high voltage is applied between the anode and cathode while a cathode filament is being heated by flowing an electric current therethrough, negatively charged thermoelectrons that are generated at the filament collide with a target on the anode surface at high speed, generating X-rays from the target. In X-ray tubes, a technique is also known in which the target on the anode is a liquid metal jet, and this target is irradiated with an electron beam to produce X-rays with high brightness.

Extreme ultraviolet light (hereinafter referred to as EUV light) having a wavelength of 13.5 nm, which is in the soft x-ray region having a relatively long wavelength among x-rays, has been recently used for exposure light. The base material of a mask for EUV lithography, the mask being provided with fine patterns, is a reflective mirror having a stacked structure, which is provided with a multilayer film (e.g., molybdenum and silicon) for reflecting EUV light on a substrate made of low-thermal-expansion glass. The EUV mask is fabricated by patterning a material that absorbs radiation having a wavelength of 13.5 nm on the multilayer film.

The size of unacceptable defects in EUV masks is much smaller than that of conventional ArF masks, making its detection difficult. Hence, EUV masks are usually inspected using radiation having a wavelength that matches the wavelength operated on lithography, which is called an actinic inspection. For example, when performed using radiation having a wavelength of 13.5 nm, the actinic inspection can detect defects with resolution better than 10 nm.

EUV light source apparatuses generally include DPP (Discharge Produced Plasma) light source apparatuses, LDP (Laser Assisted Discharge Produced Plasma) light source apparatuses, and LPP (Laser Produced Plasma) light source apparatuses. The DPP type EUV light source apparatus applies high voltage between electrodes between which discharge gas containing EUV radiation species (plasma raw material in the gas phase) is supplied to generate a high-density high-temperature plasma by the discharge, utilizing the extreme ultraviolet light radiated from the plasma.

The LDP light source apparatus is an improved version of the DPP light source apparatus. In the DPP light source apparatus, for example, a liquid high-temperature plasma raw material such as Sn (tin) or Li (lithium) containing EUV radiation species is supplied to the surface of the electrode (discharge electrode) at which the discharge occurs. The material is then irradiated with an energy beam such as a laser beam or an electron beam to vaporize the material, and then a high-temperature plasma is generated by discharge.

The LPP light source apparatus generates plasma by focusing a laser beam on a droplet that has been ejected in a form of a minute liquid droplet, which is the target material for EUV radiation, and by exciting the target material. The droplet is made of materials including tin (Sn) or lithium (Li).

In this way, the DPP method (LDP method) light source apparatus or the LPP method light source apparatus can be used as an EUV light source apparatus that generates EUV light in the soft X-ray region. Meanwhile, since DPP method (LDP method) light source apparatus uses discharge between the electrodes to generate plasma, debris caused by EUV raw materials is eventually likely to occur. In contrast, since the LPP method light source apparatus is designed to set a minute droplet made of tin, which is the EUV raw material, to be a target and focus a laser beam for excitation onto the target, thus making the configuration of the light source apparatus complex. In addition, in the LPP method light source apparatus, it is difficult to stably drop and supply the tin droplets, making it difficult to stably generate EUV light.

Japanese Patent No. 6658324 discloses a method in which a liquid target material for generating X-rays is applied to disk-shaped rotation bodies and the applied liquid material is irradiated with an energy beam (laser beam) to generate X-rays. This method is capable of obtaining high-brightness X-rays with a relatively simple configuration. Applying the method described in Japanese Patent No. 6658324 to an EUV light source apparatus corresponds to the LPP method. However, this method eliminates the need for supplying the EUV raw material in liquid in a form of a droplet. Hence, this method is capable of readily supplying the EUV material, and enables the liquid EUV material to be reliably irradiated with a laser beam, obtaining EUV radiation with a relatively simple configuration.

SUMMARY OF THE INVENTION

The LPP-type light source apparatuses such as the one described in Japanese Patent No. 6658324 use an energy beam to vaporize a liquid material, and the vaporized material is continuously irradiated with the energy beam for heating and exciting the material, thus generating a high-temperature plasma. From the generated high-temperature plasma, it is possible to extract radiation such as EUV light and X-rays having shorter wavelengths.

In this way, such a light source apparatus using plasma generated by an energy beam is expected to be applied, for example, to light sources for lithography equipment and various inspection systems. There is a need for the technology of increasing the luminous efficiency of the plasma to increase the intensity of the radiation.

In view of the above circumstances, it is desirable to provide a light source apparatus capable of improving the luminous efficiency of the plasma generated by an energy beam.

In order to achieve the above-mentioned purpose, a light source apparatus according to one embodiment of the present invention, in which an energy beam transforms a liquid raw material into plasma to extract radiation, includes a rotation body, a raw material supply section, and an electric field applying section. The rotation body is disposed at a position onto which the energy beam is incident. The raw material supply section supplies the liquid raw material to the rotation body. The electric field applying section is set to a potential different from a potential of the liquid raw material that has been supplied to the rotation body, and applies an electric field to a plasma generation area in which plasma is to be generated by irradiation of the energy beam.

In the present light source apparatus, a liquid raw material is supplied to the rotation body disposed at the position onto which the energy beam is incident. This liquid raw material is transformed into plasma by the irradiation of the energy beam. An electric field is applied to the plasma generation area, in which the plasma is generated, via the electric field applying section that is set to a potential different from that of the liquid raw material. This makes it possible to change the state of plasma, improving the luminous efficiency of the plasma generated by the energy beam.

The electric field applying section may be a conductor disposed at a position facing the rotation body and across the plasma generation area.

The rotation body may be a disk-shaped member having a front surface and a back surface, and may be disposed to allow the energy beam to be incident on the front surface. In this case, the electric field applying section may be disposed at a position opposite the front surface of the rotation body.

The light source apparatus may further include a chamber section, the chamber section including a plasma generation section that accommodates the rotation body and forms the plasma generation area, a beam introduction section that introduces the energy beam into the plasma generation area, and a radiation extraction section that extracts the radiation from the plasma that has been generated in the plasma generation area.

The electric field applying section may be a component including at least one of the plasma generation section, the beam introduction section, or the radiation extraction section.

The chamber section may include a protrusion that protrudes toward the plasma generation area. In this case, the electric field applying section may include the protrusion.

The chamber section may include a chamber body to which the beam introduction section and the radiation extraction section are connected, and a rotation body accommodation chamber that is at least partially provided inside the chamber body and that accommodates the rotation body. In this case, the electric field applying section may include the rotation body accommodation chamber.

The rotation body accommodation chamber may be insulated from the chamber body.

The radiation may include X-rays or extreme ultraviolet light.

The radiation may include extreme ultraviolet light. In this case, the electric field applying section may be set to a higher potential than the liquid raw material that has been supplied to the rotation body.

The potential of the liquid raw material may be set to a negative potential. In this case, the potential of the electric field applying section may be set to a ground potential.

The radiation may include hard X-rays. In this case, the electric field applying section may be set to a lower potential than the liquid raw material that has been supplied to the rotation body.

The potential of the liquid raw material may be set to a positive potential. In this case, the potential of the electric field applying section may be set to the ground potential.

The light source apparatus may further include a radiation measurement section that measures a state of the radiation from the plasma, and a potential control section that controls a potential difference between the liquid raw material and the electric field applying section based on a measurement result of the state of the radiation.

The radiation measurement section may measure intensity of the radiation. In this case, the potential control section may control the potential difference between the liquid raw material and the electric field applying section such that the intensity of the radiation is increased based on a measurement result of the intensity of the radiation.

The energy beam may include a laser beam.

The light source apparatus according to the present invention is capable of improving the luminous efficiency of the plasma generated by the energy beam.

DETAILED DESCRIPTION OF THE EMBODIMENTS

Hereinafter, embodiments according to the present invention will be described with reference to the accompanying drawings.

First Embodiment

Basic Configuration of Light Source Apparatus

Figure 1:
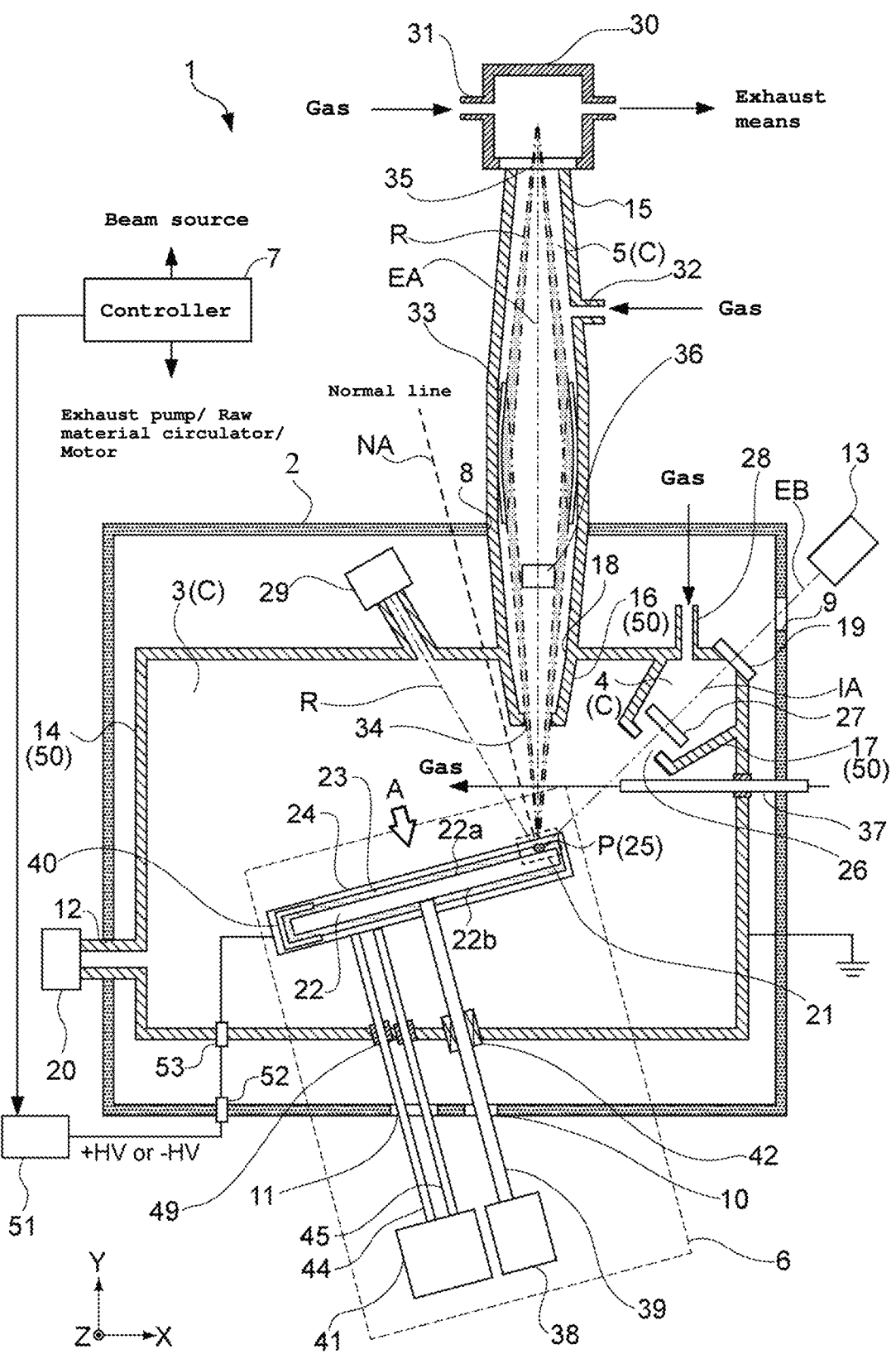
FIG. 1 is a schematic diagram illustrating a configuration example of a light source apparatus according to a first embodiment of the present invention.

FIG. 1 is a schematic diagram illustrating a configuration example of a light source apparatus according to a first embodiment of the present invention. FIG. 1 illustrates a schematic cross section of the light source apparatus 1 when the light source apparatus 1 is cut along the horizontal direction at a predetermined height from its installation surface and viewed from above. In FIG. 1, the illustration of the cross section is omitted for portions for which the configuration of the cross section does not need to be explained in order to facilitate the understanding of the configuration and operation of the light source apparatus 1. Hereinafter, the X direction is denoted as the left-right direction (the positive side of the X axis is the right side and the negative side is the left side), the Y direction is denoted as the front-rear direction (the positive side of the Y axis is the front side and the negative side is the rear side), and the Z direction is denoted as the height direction (the positive side of the Z-axis is the upper side, and the negative side is the lower side). Obviously, the application of the present technology is not limited to the direction in which the light source apparatus 1 is used.

The light source apparatus 1 is a light source apparatus of the LPP method in which an energy beam EB transforms plasma raw material 23 into plasma to extract radiation R. The light source apparatus 1 is capable of emitting the radiation R ranging from hard X-rays having a wavelength of 30 nm or less to soft X-rays (including EUV light), for example. Hence, the light source apparatus 1 can be used as an X-ray generator or an EUV light source apparatus (EUV radiation generator). Obviously, the present technology can also be applied to light source apparatuses that emit radiation in other wavelength bands. Hereinafter, the area in which plasma P is generated by the irradiation of the energy beam EB is referred to as a plasma generation area 21.

The light source apparatus 1 includes an enclosure 2, a vacuum chamber 3, an energy beam incident chamber 4, a radiation emission chamber 5, a raw material supply mechanism 6, and a controller 7. The enclosure 2 is configured such that its external shape is approximately a cube. The enclosure 2 includes an emission hole 8 formed in the front face of the enclosure 2, an incident hole 9 formed in the right side face thereof, two through-holes 10 and 11 formed in the rear face thereof, and a through-hole 12 formed in the left side face thereof. The enclosure 2 can be made of any materials; for example, the enclosure is made of metal.

In the present embodiment, the radiation R is set to allow its emission axis EA to pass through the emission hole 8 in the front face and extend in the Y-direction (front-rear direction). The radiation R such as X-rays and EUV light is extracted along the emission axis EA and emitted through the emission hole 8 toward the front side. In the present embodiment, the energy beam EB is set to allow an incident axis IA to extend from the incident hole 9 on the right side face toward the rear side at an oblique angle to the left. As shown in FIG. 1, a beam source 13 that emits the energy beam EB is disposed outside the enclosure 2. The beam source 13 is disposed to allow the energy beam EB to enter the interior of the enclosure 2 along the incident axis IA. Examples of the energy beam EB include an electron beam or a laser beam. The beam source 13 can be configured to employ any configurations capable of emitting these energy beams EB.

The light source apparatus 1 is provided with a chamber section C that includes a plurality of chambers. Specifically, the chamber section C includes a vacuum chamber 3, an energy beam incident chamber (hereinafter simply referred to as the "incident chamber") 4, and a radiation emission chamber (hereinafter simply referred to as the "emission chamber") 5. The vacuum chamber 3, the incident chamber 4, and the emission chamber 5 are spatially communicated with each other. In other words, the vacuum chamber 3 and the incident chamber 4 are connected to each other. Similarly, the vacuum chamber 3 and the emission chamber 5 are connected to each other.

The vacuum chamber 3 serves to achieve the "plasma generation section" in which plasma of the plasma raw material 23 is generated by the irradiation of the energy beam EB. Hence, the plasma generation area 21 described above is formed in the vacuum chamber 3. In addition, the incident chamber 4 serves to achieve the "beam introduction section" in which the energy beam is taken into the plasma generation area. The incident chamber 4 is formed to be located along the incident axis IA of the energy beam EB. Furthermore, the emission chamber 5 serves to achieve the "radiation extraction section" in which radiation is extracted and emitted from the plasma that has been generated in the plasma generation area. The emission chamber 5 is disposed along the emission axis EA of the radiation R.

In the present embodiment, the chamber section C (the vacuum chamber 3, the incident chamber 4, and the emission chamber 5) includes a chamber body 14, an outer protrusion 15 protruding from the front face of the chamber body 14 toward the front side, and two inner protrusions 16 and 17 protruding inward from the inner circumferential face of the chamber body 14. The chamber body 14, the outer protrusion 15, and the two inner protrusions 16 and 17, which constitute the chamber C, are made of metal materials.

The chamber body 14 is configured such that its external shape is approximately rectangular, and has its front, rear, left, and right faces that are arranged to face the front, rear, left and right faces of the enclosure 2, respectively. The chamber body 14 has a right-front corner, which is located between the front face and the right side face, that is disposed to be on the incident axis IA of the energy beam EB.

As shown in FIG. 1, an emission hole 18 is formed in the front face of the chamber body 14. The emission hole 18 is formed along the emission axis EA of the radiation R, and in line with the emission hole 8 in the front face of the enclosure 2. The outer protrusion 15 is configured to protrude forward from the circumferential edge of the emission hole 18 in the chamber body 14. The outer protrusion 15 is configured to protrude more forward than the emission hole 8 of the enclosure 2 with being inscribed in the emission hole 8 of the enclosure 2. The inner protrusion 16 is configured to protrude inward from the circumferential edge of the emission hole 18 inside the chamber body 14. The space surrounded by the outer protrusion 15 and the inner protrusion 16 serves as the emission chamber 5. The outer protrusion 15 and the inner protrusion 16 themselves, which are the components constituting the emission chamber 5, can also be referred to as the emission chamber. The outer protrusion 15 and the inner protrusion 16 may be formed integrally with the chamber body 14, or they may be formed separately and then connected to the chamber body 14.

The emission chamber 5 is configured to have a cone shape with its central axis being aligned with the emission axis EA of the radiation R. The emission chamber 5 is configured to have a large cross-sectional area at its center portion in the direction of the emission axis EA of the radiation R, and have the cross-sectional area being decreased toward the front and rear ends. In other words, the emission chamber 5 is shaped to taper toward the front and rear ends.

An incident window 19 is formed in the right-front corner of the chamber body 14. The incident window 19 is formed along the incident axis IA of the energy beam EB, and in line with the incident hole 9 in the right side face of the enclosure 2. The inner protrusion 17 is configured to protrude inside the right-front corner of the chamber body 14 along the incident axis IA of the energy beam EB from a position surrounding the incident window 19. In the internal space of the chamber body 14, the space surrounded by the inner protrusion 17 serves as the incident chamber 4. The inner protrusion 17 and the right-front corner of the chamber body 14 themselves, which are the components constituting the incident chamber 4, can also be referred to as the incident chamber. The inner protrusion 17 may be formed integrally with the chamber body 14, or it may be formed separately and then connected to the chamber body 14.

The incident chamber 4 is configured to have a cone shape with its central axis being aligned with the incident axis IA of the energy beam EB. The incident chamber 4 is config-ured to have a cross-sectional area being decreased toward its end inside the chamber body 14 in the direction of the incident axis IA of the energy beam EB. In other words, the incident chamber 4 has a tapered shape toward the end thereinside.

In the internal space of the chamber body 14, the space excluding the internal space of the inner protrusion 16, which serves as the emission chamber 5, and the internal space of the inner protrusion 17, which serves as the incident chamber 4, serves as the vacuum chamber 3. The compo-nents themselves constituting the vacuum chamber 3 can also be referred to as the vacuum chamber. As shown in FIG. 1, the chamber body 14 has a portion that protrudes through the through-hole 12 in the left side face of the enclosure 2 to the outside of the enclosure 2, and the portion has a front end connected to an exhaust pump 20. The exhaust pump 20 exhausts the inside of the vacuum chamber 3 and depres-surizes the vacuum chamber 3. This suppresses the attenu-ation of the radiation R generated in the vacuum chamber 3. The inside of the vacuum chamber 3 is not necessarily a vacuum atmosphere, provided that it is a reduced-pressure atmosphere with respect to the incident chamber 4 and the emission chamber 5. The inside of the vacuum chamber 3 may be supplied with an inert gas. The specific configuration of the exhaust pump 20 is not limited, and any pump such as a vacuum pump can be used.

The raw material supply mechanism 6 generates the plasma P in the plasma generation area 21 in the vacuum chamber 3 and emits the radiation R (X-rays, EUV light). The raw material supply mechanism 6 includes a disk-shaped rotation body 22 for supplying raw material, and a container 24 that accommodates the liquid-phase plasma raw material (radiation raw material) 23. The rotation body 22 and the container 24 are disposed inside the vacuum chamber 3. As shown in FIG. 1, the disk-shaped rotation body 22 has an incident area 25 in which the energy beam EB is incident. The rotation body 22 is disposed in the vacuum chamber 3 such that the incident area 25 is located at the intersection of the incident axis IA and the emission axis EA. The incident area 25 of the rotation body 22 is supplied with the plasma raw material 23 and irradiated with the energy beam EB incident therein to generate the plasma P. The area (space) where the plasma P is generated in the vacuum chamber 3 becomes the plasma generation area 21. Accordingly, the plasma generation area 21 is the area corresponding to the position of the incident area 25 of the rotation body 22.

The light source apparatus 1 is provided with an electric field applying section 50 that applies an electric field to the plasma generation area 21 where the plasma P is generated by the irradiation of the energy beam EB in this manner. The electric field applying section 50 is a component that is set to a potential different from that of the plasma raw material 23 that has been supplied to the rotation body 22. Hence, the potential of the electric field applying section 50 is set to a high potential or a low potential with respect to that of the plasma raw material 23.

Typically, the electric field applying section 50 is a conductor that is positioned to face the rotation body 22 such that the plasma generation area 21 is located between the electric field applying section 50 and the rotation body 22. In particular, the electric field applying section 50 is exposed to the high-temperature plasma P, thus it is preferably made of materials including a metal with a high melting point. Setting appropriately the potential of the electric field apply-ing section 50 generates an electric field in a space between the plasma raw material 23 and the electric field applying section 50, the electric field corresponding to a potential difference (voltage) between the plasma raw material 23 and the electric field applying section 50. This electric field is applied to the plasma generation area 21.

In the present embodiment, the electric field applying section 50 is a member constituting the chamber section C. Specifically, a member constituting at least one of the vacuum chamber 3, the incident chamber 4, or the emission chamber 5 is used as the electric field applying section 50. In the example shown in FIG. 1, the chamber body 14 constituting the vacuum chamber 3, the inner protrusion 16 constituting the emission chamber 5, and the inner protru-sion 17 constituting the incident chamber 4 are electrically connected to each other. The chamber body 14, the inner protrusion 16, and the inner protrusion 17 constitute the electric field applying section 50. The potential set in the electric field applying section 50 and the behavior of the plasma P to which the electric field is applied will be described in detail later.

The controller 7 controls the operation of each component provided in the light source apparatus 1. For example, the controller 7 controls the operation of the beam source 13 and the exhaust pump 20. In addition, the controller 7 controls the operation of various motors, plasma raw material circu-lators, external voltage sources, etc., which will be described later. The controller 7 includes computer hardware circuits necessary for computers, such as CPUs and memories (RAM, ROM). A CPU loads a control program stored in a memory into a RAM and executes it to perform various processes. As the controller 7, a programmable logic device (PLD) such as field programmable gate array (FPGA), and other devices such as application specific integrated circuit (ASIC) may be used. In FIG. 1, the controller 7 is sche-matically illustrated as a functional block; however, the controller 7 may be designed in any desired manner includ-ing the position in which the controller 7 is configured.

In the present embodiment, the controller 7 controls the potential difference between the plasma raw material 23 and the electric field applying section 50 based on measurement results of the state of the radiation R from a radiation diagnosis section 29 that will be described later. In the example shown in FIG. 1, the light source apparatus 1 is connected to an external voltage source 51. The external voltage source 51 is connected to the plasma raw material 23 (container 24) and applies any given voltage to the plasma raw material 23. The controller 7 adjusts the output of the external voltage source 51 in response to the state of the radiation R to control the potential difference between the plasma raw material 23 and the electric field applying section 50. Hereinafter, the potential difference between the plasma raw material 23 and the electric field applying section 50 is referred to as a voltage V applied to the plasma generation area 21. In the present embodiment, the control-ler 7 serves as a potential control section.

Hereinafter, the various chambers constituting the light source apparatus 1 and the raw material supply mechanism 6 will be described in detail.

Incident Chamber

The incident chamber 4 includes the inner protrusion 17 at the right-front corner of the chamber body 14. The incident window 19 is provided in the right-front corner of the chamber body 14. The energy beam EB emitted from the beam source 13 is incident inside the incident chamber 4 through the incident window 19 along the incident axis IA. Note that the incident axis IA of the energy beam EB can also be referred to as the optical axis (principal axis) of the energy beam EB incident inside the incident chamber 4.

The incident window 19 is made of a material that is transmissive to the energy beam EB and is designed with a thickness that can withstand a pressure difference between the inside and outside of the incident chamber 4. Examples of the incident window 19 include a metal film such as titanium or aluminum when the energy beam EB is an electron beam. Examples of the incident window 19 include glass material (quartz glass) when the energy beam EB is a laser beam. The incident window 19 can be made of any other material that is transmissive to the energy beam EB.

The inner protrusion 17 protrudes toward the incident area 25 on a front surface 22a of the rotation body 22 and is provided with an incident aperture 26 at the front end of the protrusion. The incident aperture 26 is located in line with the incident window 19 along the incident axis IA of the energy beam EB. The incident aperture 26 allows the energy beam EB to be incident through the incident chamber 4 into the vacuum chamber 3. In other words, the energy beam EB traveling along the incident axis IA through the incident window 19 passes through the incident aperture 26 and is incident into the rotation body 22 located in the vacuum chamber 3.

A capturing mechanism is disposed to capture the scattered plasma raw material 23 and debris inside the incident chamber 4. In the example shown in FIG. 1, provided is a rotary window 27 that is a plate-shaped rotation member for transmitting the energy beam EB and capturing the plasma raw material 23 and debris, as the capturing mechanism. The rotary window 27 is configured, for example, to be disk-shaped. The rotary window 27 is provided with a rotation shaft of a motor, which is not shown in the figure, attached to its center. The motor rotates the rotation shaft, which in turn rotates the rotary window 27. The motor is driven and controlled by the controller 7. The motor is disposed outside the enclosure 2, and the rotation shaft is connected to the rotary window 27 through through-holes that are formed in the enclosure 2 and the chamber body 14, which are not shown in the figure. A mechanical seal is used to introduce the rotation shaft into the chamber body 14, allowing the rotary window 27 to rotate while maintaining the atmosphere in the incident chamber 4 (gas atmosphere as will be described below). The rotation shaft that rotates the rotary window 27 is located offset from the incident axis IA of the energy beam EB. This allows the energy beam EB to travel through the beam transmission area of the rotary window 27 without being interfered by the rotation shaft of the rotary window 27. Rotating the rotary window 27 makes it possible to increase the substantial area of the beam transmission area of the rotary window 27, achieving a longer service life of the rotary window 27 and reducing the frequency of replacement of the rotary window 27.

As shown in FIG. 1, the chamber body 14 is provided with a gas injection channel 28 that is communicated with the incident chamber 4. Through the gas injection channel 28, gas is supplied to the incident chamber 4 from a gas supply system, which is omitted in the figure. The gas supplied is a gas that has high transmittance to the energy beam EB, for example, a noble gas including argon (Ar) and helium (He). The gas is supplied to increase the pressure inside the incident chamber 4. In other words, supplying the incident chamber 4 with gas from the gas injection channel 28 enables the internal pressure of the incident chamber 4 to maintain a sufficiently higher pressure than the internal pressure of the vacuum chamber 3. The inner protrusion 17 has a cone shape having a smaller cross-sectional area toward the side of the protrusion (the side in which the incident aperture 26 is formed). The incident aperture 26 is provided at the front end of the inner protrusion 17. This configuration is favorable for supplying gas to increase the internal pressure of the incident chamber 4. In addition, the inner protrusion 17 configured in a cone shape contributes to reducing the space occupied by the inner protrusion 17 in the chamber body 14. This allows for more flexibility in designing the arrangement of other components, thereby downsizing the apparatus.

Emission Chamber

The emission chamber 5 has a cone-shape with the emission axis EA as its central axis, and the front end (front end of the outer protrusion 15) of the emission chamber 5 is connected to a utilization apparatus such as a mask inspection device. In the example shown in FIG. 1, an application chamber 30 is connected as a chamber that forms part of the utilization apparatus. The pressure inside the application chamber 30 may be atmospheric pressure. The interior of the application chamber 30 may be purged with gas (e.g., inert gas) introduced from a gas injection channel 31, if necessary. The gas inside the application chamber 30 may be exhausted by an exhaust means, which is not shown in the figure.

As shown in FIG. 1, the outer protrusion 15 is provided with a gas injection channel 32 that is communicated with the emission chamber 5. Through the gas injection channel 32, gas is supplied to the emission chamber 5 from a gas supply device, which is omitted in the figure. The gas supplied is a gas that has high transmittance to the radiation R, for example, a noble gas such as argon and helium. Argon and helium can be used as gases having high transmittance for both the energy beam EB and the radiation R. Hence, the same gas may be supplied to both the incident chamber 4 and the emission chamber 5. This case makes it possible to use a gas supply system in common, thus simplifying the apparatus. Of course, the gas supplied to the incident chamber 4 may be different from the gas supplied to the emission chamber 5. The gas is supplied to increase the pressure inside the emission chamber 5. In other words, supplying the emission chamber 5 with gas from the gas injection channel 32 enables the internal pressure of the emission chamber 5 to maintain a sufficiently higher pressure than the internal pressure of the vacuum chamber 3.

Inside the emission chamber 5, provided is a collector (focusing mirror) 33 that guides and focuses the radiation R incident into the emission chamber 5 into the utilization apparatus (inside the application chamber 30). In FIG. 1, the component of the radiation R that is incident into the emission chamber 5 and focused is illustrated in hatching. The outer surface of the collector 33 is in contact with the inner surface of the emission chamber 5 (inner surface of the outer protrusion 15) for the purpose of cooling and alignment. The collector 33 may be, for example, a single-shell grazing incidence reflector. The collector 33 is made of a metal member such as aluminum (Al), nickel (Ni), or stainless steel.

The collector 33 is optionally provided with a reflective coating on the inner reflective surface thereof. The reflective coating that reflects the radiation R is suitably made of a material such as ruthenium (Ru). Instead of being a structure in which its body is coated with Ru, which is expensive, the collector 33 may be configured to have a body made of glass (silicon dioxide: SiO2) and to make its inner surface be polished to form a radiation reflecting surface. Although the collector made of glass has a lower reflectivity than the collector made of metal applied with a Ru coating, the material of the collector made of glass is much less expensive than that of the collector with a Ru coating, thereby enabling the collector 33 to be replaced frequently.

The inner protrusion 16, which constitutes the emission chamber 5, protrudes toward the incident area 25 on the front surface 22a of the rotation body 22, and is provided with an emission aperture 34 at the front end of the protrusion. The emission aperture 34 is located in line with the emission hole 18 of the chamber body 14 and the emission hole 8 of the enclosure 2 along the emission axis EA of the radiation R. The emission aperture 34 allows the radiation R to enter the incident chamber 5 from the vacuum chamber 3. In other words, a portion of the radiation R emitted from the plasma P is incident into the collector 33 through the emission aperture 34. The radiation R that has been incident into the collector 33 is guided and focused by the collector 33 in the application chamber 30. Designing the aperture area of the emission aperture 34 appropriately makes it possible to control the aperture angle of the radiation R incident on the collector 33. Note that the emission axis EA of the radiation R can also be referred to as the optical axis (principal axis) of the radiation R taken into the emission chamber 5 from the plasma P.

The inner protrusion 16 has a cone shape having a smaller cross-sectional area toward the side of the protrusion (the side in which the emission aperture 34 is formed). Hence, the inner protrusion 16 can also be referred to as a collector cone. The emission aperture 34 is provided at the front end of the inner protrusion 16, which has a cone shape. This configuration is favorable for supplying gas to increase the internal pressure of the emission chamber 5. In addition, the inner protrusion 16 configured in a cone shape contributes to reducing the space occupied by the inner protrusion 16 in the chamber body 14. This allows for more flexibility in designing the arrangement of other components, thereby downsizing the apparatus.

As shown in FIG. 1, a filter film 35 is provided between the emission chamber 5 and the application chamber 30. The filter film 35 serves to physically separate (physically separate the space) the plasma generation area 21 in the vacuum chamber 3 from the application chamber 30, preventing scattered plasma raw material 23 and debris from entering the application chamber 30. The filter film 35 is made of a material that transmits the radiation R generated in the plasma generation area 21. When the radiation R is X-rays, the filter film 35 is constituted by, for example, a beryllium thin film that has a very high transmittance for X-rays. When the radiation R is EUV light, the filter film 35 is made of zirconium (Zr), for example.

Although being supplied with gas, the inside of the emission chamber 5 has a reduced-pressure atmosphere because it is spatially communicated with the vacuum chamber 3. In contrast, the inside of the application chamber 30 may have an atmospheric pressure as described above. In this case, there is a pressure difference between the emission chamber 5 and the application chamber 30. Accordingly, the filter film 35 has a thickness durable enough to withstand this pressure difference. In other words, the filter film 35 is configured to avoid destroying the reduced-pressure atmosphere in the emission chamber 5, which is spatially communicated with the vacuum chamber 3.

A shielding member (central occultation) 36 is disposed inside the emission chamber 5. The shielding member 36 is located in line with the emission hole 18 of the chamber body 14, the emission hole 8 of the enclosure 2, and the filter film 35 along the emission axis EA of the radiation R. Among the radiation R emitted from the plasma P and incident into the emission chamber 5, there can be radiation components that are not focused by the collector 33 and that travel in the emission chamber 5. At least part of this unfocused radiation components spread out while traveling. Typically, such radiation components are unusable with the utilization equipment and often unnecessary. In the present embodiment, the shielding member 36 can block the radiation components that are not focused by the collector 33.

As shown in FIG. 1, in the present embodiment, a gas nozzle 37 is disposed on the rear side of the incident chamber 4, extending in the left-right direction. The gas nozzle 37 is disposed in the right side face of the chamber body 14 using a seal member or the like. The gas nozzle 37 is connected to a gas supply device, which is omitted from the figure, to supply the chamber body 14 with gas. In the example shown in FIG. 1, the gas nozzle 37 ejects gas from the right side of an area between the incident axis IA and the emission axis EA toward the left side thereof in the left-right direction. This allows the debris that has been released from the incident area 25 to move in a direction away from the incident axis IA and the emission axis EA.

Raw Material Supply Mechanism

Figure 2:
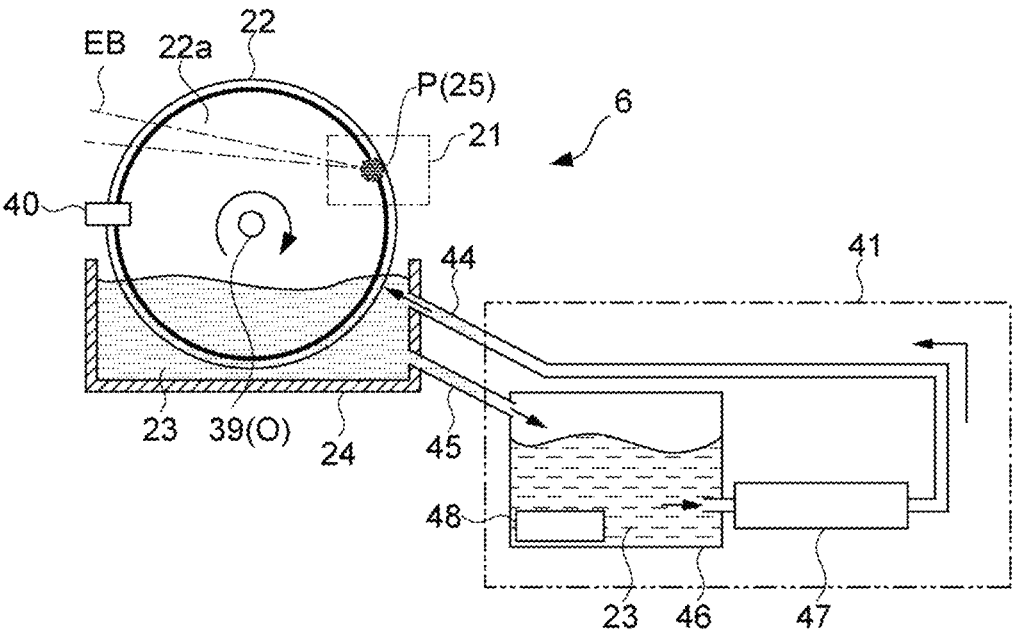
FIG. 2 is a schematic diagram illustrating a configuration example of a raw material supply mechanism.

FIG. 2 is a schematic diagram illustrating a configuration example of the raw material supply mechanism 6. FIG. 2 illustrates the rotation body 22 and the container 24 viewed from the direction of arrow A in FIG. 1. Accordingly, the front surface 22a of the rotation body 22 is illustrated in FIG. 2. As shown in FIGS. 1 and 2, the raw material supply mechanism 6 includes the rotation body 22, the container 24, a motor 38, a shaft 39, a skimmer 40, and a plasma raw material circulator 41.

The rotation body 22 is a disk-shaped member that rotates around a rotation axis O to supply the plasma raw material 23 to the plasma generation area 21. The rotation body 22 has the front surface 22a and a back surface 22b, and is arranged such that the energy beam EB is incident onto the front surface 22a. The incident area 25 onto which the energy beam EB is incident is set at a predetermined position of the front surface 22a. Conversely, of the two main surfaces of the rotation body 22, the main surface on which the incident area 25, onto which the energy beam EB is incident, is set becomes the front surface 22a and the opposite main surface becomes the back surface 22b.

Hence, the plasma generation area 21, in which the plasma P is generated, is an area facing the front surface 22a of the rotation body 22. The electric field applying section 50, which applies an electric field to the plasma generation area 21, is disposed opposite the front surface 22a of the rotation body 22. Here, the arrangement opposite the front surface 22a means, for example, the arrangement facing the front surface 22a (in sight from the front surface 22a). In the example shown in FIG. 1, the inner wall of the front side of the chamber body 14 and the inner protrusion 17, which serve as the electric field applying section 50, are disposed opposite the front surface 22a. Thus, using the members opposite the front surface 22a as the electric field applying section 50 makes it possible to efficiently apply the electric field to the plasma generating area 21.

In order to apply an electric field to the plasma generation area 21, the parts of the raw material supply mechanism 6 that are in contact with the plasma raw material 23 (rotation body 22, container 24, skimmer 40, and plasma raw material circulator 41) and the parts electrically connected to them (motor 38 and shaft 39) are insulated from the parts that serve as the electric field applying section 50 (in FIG. 1, chamber body 14, inner protrusions 16 and 17). Accordingly, the container 24 is mounted in the chamber body 14 via an insulating base or other means, and the parts to which the container 24 and the rotation body 22 are connected are also suitably configured to avoid short-circuits with the chamber body 14 or other parts.

The rotation body 22 is made of a high-melting point metal such as tungsten (W), molybdenum (Mo), or tantalum (Ta). The lower side of the rotation body 22 is partially immersed in the plasma raw material 23 stored in the container 24. The position of the rotation body 22 and the amount of the plasma raw material 23 stored in the container 24 are set such that at least a part of the front surface 22a of the rotation body 22 is immersed in the plasma raw material 23.

When X-rays are emitted as the radiation R, X-ray raw materials are used as the plasma raw material 23. The X-ray raw material is a metal that is in the form of liquid at room temperature. Examples of the X-ray raw material include gallium (Ga), and gallium alloys such as Galinstan (registered trademark), which is a eutectic alloy of gallium, indium (In), and tin (Sn). When EUV light is emitted as the radiation R, EUV raw materials are used as the plasma raw material 23. Examples of the raw material that emits EUV light include tin (Sn) and lithium (Li) that are in the form of liquid. Since Sn and Li are solid at room temperature, the container 24 is provided with a temperature control means, which is omitted from the figure. For example, when the EUV raw material is Sn, the container 24 is maintained at a temperature above the melting point of Sn.

The shaft 39 of the motor 38 is connected to the center of the back surface 22b of the rotation body 22. The controller 7 controls the operation of the motor 38, which allows the rotation body 22 to rotate via the shaft 39. The shaft 39 is a pillar-shaped member extending in a direction orthogonal to the front surface 22a of the rotation body 22. The central axis of the shaft 39 is the rotation axis O of the rotation body 22 and the motor 38. The shaft 39 passes through the through-hole 10 in the enclosure 2, and is introduced into the vacuum chamber 3 via a mechanical seal 42. The shaft 39 is disposed to avoid being in contact with the enclosure 2 (through-hole 10). The mechanical seal 42 allows the shaft 39 to rotate while maintaining a reduced-pressure atmosphere in the vacuum chamber 3. The mechanical seal 42 is constituted by an electrically insulating material, allowing the shaft 39 (rotation body 22) to be insulated from the vacuum chamber 3.

As described above, the rotation body 22 is disposed to be immersed in the plasma raw material 23 stored in the container 24. In this state, when the rotation body 22 rotates around the shaft 39, the plasma raw material 23 that has spread on the front surface 22a is pulled up from the container 24. This method allows the plasma raw material 23 to be applied over the entire circumference of the front surface 22a. The plasma raw material 23 that has been applied to the front surface 22a is transported to the incident area 25 of the energy beam EB with the rotation of the rotation body 22. Thus, in the present embodiment, the container 24, the motor 38, and the shaft 39 allow the plasma raw material 23 to be supplied to the rotation body 22. In the present embodiment, the raw material supply section is achieved by the container 24, the motor 38, and the shaft 39.

As shown in FIG. 2, in the present embodiment, the incident area 25, onto which the energy beam EB is incident, is provided in the vicinity of the circumferential edge of the front surface 22a of the rotation body 22. The configuration and operation of the raw material supply section (motor 38 and shaft 39) are appropriately designed to supply this incident area 25 with the plasma raw material 23.

The skimmer 40 is provided at a predetermined position in the circumferential edge of the rotation body 22 as a thickness adjustment member for adjusting the thickness of the plasma raw material 23 supplied on the front surface 22a of the rotation body 22 to a predetermined thickness. The skimmer 40 is a structure having, for example, a channel structure, and is disposed with a predetermined gap apart from the front surface 22a of the rotation body 22 in a manner to sandwich the rotation body 22 thereinside. The skimmer 40 serves as a scraper that scrapes off part of the plasma raw material 23 that has been applied to the front surface 22a of the rotation body 22.

The interval between the front surface 22a of the rotation body 22 and the skimmer 40 corresponds to the thickness of the plasma raw material 23 in the incident area 25 of the front surface 22a of the rotation body 22, onto which the energy beam EB is incident. The skimmer 40 is positioned to allow the thickness of the plasma raw material 23 in the incident area 25 of the front surface 22a of the rotation body 22 to be adjusted to a predetermined thickness. The interval between the front surface 22a of the rotation body 22 and the skimmer 40 is set appropriately. This allows the liquid plasma raw material 23 that has been applied to the rotation body 22 in the raw material storage portion of the container 24 to be adjusted such that the thickness of on the rotation body 22 becomes a predetermined thickness when the liquid plasma raw material 23 passes through the skimmer 40 due to the rotation of the rotation body 22.

The plasma raw material 23 on the rotation body 22, the thickness of which has been adjusted by the skimmer 40, is transported to the incident area 25, onto which the energy beam EB is incident, along with the rotation of the rotation body 22. In other words, the direction of rotation of the rotation body 22 is a direction in which the plasma raw material 23 on the rotation body 22 passes through the skimmer 40 and then transported to the incident area 25. In the incident area 25, the plasma raw material 23 on the rotation body 22 is irradiated with the energy beam EB to generate the plasma P. The skimmer 40 makes it possible to nearly uniformly supply the plasma raw material 23 to the incident area 25. Stabilizing the thickness of the plasma raw material 23 in the incident area 25 is capable of stabilizing the intensity of the radiation R emitted from the plasma P.

The plasma raw material circulator 41 appropriately replenishes the container 24 with the plasma raw material 23 when the plasma raw material 23 is consumed due to the operation of generating the radiation R. The plasma raw material circulator 41 also serves as a temperature adjustment mechanism (cooling mechanism) for the plasma raw material 23.

As shown in FIG. 2, the plasma raw material circulator 41 includes a raw material inlet pipe 44, a raw material outlet pipe 45, a raw material storage tank 46, a raw material drive section (pump) 47, and a temperature adjustment mechanism 48. The raw material storage tank 46 stores the plasma raw material 23. The raw material inlet pipe 44 and the raw material outlet pipe 45 are disposed between the raw material storage tank 46 and the container 24 to communicate the raw material storage tank 46 with the container 24. The raw material drive section 47 is disposed in the raw material inlet pipe 44. Driving the raw material drive section 47 allows the plasma raw material 23 that has been stored in the raw material storage tank 46 to flow into the raw material inlet pipe 44, circulating the plasma raw material 23 in the circulation system of the raw material storage tank 46, the raw material inlet pipe 44, the container 24, and the raw material outlet pipe 45. Examples of the raw material drive section 47 include an electromagnetic pump capable of transporting liquid metal (plasma raw material 23) using magnetic force; however, other types of pumps may also be used.

In the present embodiment, the raw material storage tank 46 and the raw material drive section 47 are disposed outside the vacuum chamber 3 and also outside the enclosure 2. The raw material inlet pipe 44 and the raw material outlet pipe 45, which extend from the plasma raw material circulator 41 to the container 24, pass through the through-hole 11 in the enclosure 2, are introduced into the vacuum chamber 3 via a seal member 49, and are connected to the container 24. In this case, the raw material inlet pipe 44 and the raw material outlet pipe 45 are arranged to avoid being in contact with the enclosure 2 (through-hole 11). The seal member 49 allows the raw material inlet pipe 44 and the raw material outlet pipe 45 to penetrate from the outside to the inside of the vacuum chamber 3 while maintaining a reduced-pressure atmosphere in the vacuum chamber 3. The seal member 49 is constituted by an electrically insulating material, allowing the raw material inlet pipe 44 and the raw material outlet pipe 45 (plasma raw material 23) to be insulated from the vacuum chamber 3.

The plasma raw material 23 that has been applied onto the front surface 22a of the rotation body 22 is consumed at the area that is irradiated with the energy beam EB. Hence, in order to stably operate the generation of the radiation R (X-ray or EUV light) for a long period of time, a large volume of the plasma raw material 23 needs to be stored in the container 24. Meanwhile, the size of the vacuum chamber 3 of the light source apparatus 1 has restrictions on the size of the container 24 that can be accommodated inside the vacuum chamber 3, thus there may be many cases in which the container 24 does not store a large volume of the plasma raw material 23. Hence, the raw material storage tank 46 capable of storing a large volume of the plasma raw material 23 is disposed outside the vacuum chamber 3, and is configured to replenish the raw material storage portion of the container 24 with the plasma raw material 23 via the raw material inlet pipe 44. This configuration allows the amount of the plasma raw material 23 in the raw material storage portion of the container 24 to be maintained at a constant level over a long period of time, thus enabling the stable operation of generating the radiation R over a long period of time. In other words, the plasma raw material circulator 41 circulates the plasma raw material 23 between the raw material storage portion of the container 24 and the raw material storage tank 46 such that the amount of the plasma raw material 23 in the raw material storage portion of the container 24 is maintained at a constant level.

When the plasma raw material 23 that has been applied onto the front surface 22a of the rotation body 22 is irradiated with the energy beam EB, the radiation R is generated from the plasma raw material 23 (target), and at the same time, the rotation body 22 itself is heated. Whenever this heated rotation body 22 passes through the raw material storage portion of the container 24 in which the plasma raw material 23 is stored, the heat in the heated rotation body 22 is transferred to the plasma raw material 23 in the container 24. Hence, the temperature of the plasma raw material 23 in the container 24 gradually varies. When the viscosity of the plasma raw material 23 varies with temperature, the temperature variations of the plasma raw material 23 cause wettability variations of the rotation body 22 with respect to the plasma raw material 23, thereby varying the adhesion state of the plasma raw material 23 to the rotation body 22. As a result, the output of the radiation R may also vary.

The plasma raw material circulator 41 according to the present embodiment includes the raw material storage tank 46 that has a relatively large capacity outside the vacuum chamber 3 (outside the enclosure 2). Hence, even if the plasma raw material 23 that has varied in temperature in the raw material storage portion of the container 24 flows into the raw material storage tank 46 via the raw material outlet pipe 45, the temperature of the plasma raw material 23 in the raw material storage tank 46 does not vary much and remains nearly constant. The plasma raw material 23, the temperature of which is maintained nearly constant, flows into the container 24 via the raw material inlet pipe 44. In this way, circulating the plasma raw material 23 through the plasma raw material circulator 41 enables the temperature of the plasma raw material 23 in the container 24 to be maintained at a nearly constant level. Therefore, this configuration is also capable of stabilizing the adhesion state of the plasma raw material 23 to the rotation body 22, stabilizing the output of the radiation R.

In addition, the temperature of the plasma raw material 23 in the raw material storage tank 46 may be adjusted by the temperature adjustment mechanism 48 that is provided inside the raw material storage tank 46. Since the raw material storage tank 46 is disposed outside the vacuum chamber 3 (outside the enclosure 2), the temperature adjustment mechanism 48 can have a large capacity, which is unaffected by the size of the vacuum chamber 3. This makes it possible to reliably adjust the temperature of the plasma raw material 23 to a predetermined temperature in a short time.

In this way, utilizing the plasma raw material circulator 41 including the temperature adjustment mechanism 48 makes it possible to supply the raw material storage portion of the container 24 with the plasma raw material 23 while maintaining the temperature of the plasma raw material 23 at a constant level. For example, in the case that a liquid metal whose temperature in its liquid state is lower than room temperature is used as the plasma raw material 23, this configuration also makes it possible to supply the container 24 with the plasma raw material 23 in the liquid phase while maintaining the temperature thereof lower than room temperature. Alternatively, in the case that a liquid metal whose temperature in its liquid state is higher than room temperature is used as the plasma raw material 23, this configuration also makes it possible to supply the container 24 with the plasma raw material 23 in the liquid phase while maintaining the temperature thereof higher than room temperature.

As shown in FIG. 1, in the present embodiment, the radiation diagnosis section 29 is provided on the front side of the chamber body 14, in the area spatially communicated with the vacuum chamber 3. The radiation diagnosis section 29 is disposed at a position at which the radiation R emitted in a direction different from the emission axis EA is incident. The radiation diagnosis section 29 measures the state of the radiation R emitted from the plasma P. Here, the state of the radiation R means the physical state of radiation R, such as intensity, wavelength, and spectrum of radiation R. The radiation diagnosis section 29 includes a detector that detects the presence or absence of radiation R and a measurement device that measures the output of radiation R, for example. The measurement results with the radiation diagnosis section 29 are used to diagnose the radiation R or to control the voltage V applied to the plasma P.

As shown in FIG. 1, the external voltage source 51 is disposed outside the enclosure 2 in the present embodiment. The external voltage source 51 can outputs, for example, a positive high voltage (+HV) with respect to the GND potential or a negative high voltage (−HV) with respect to the GND potential. The external voltage source 51 includes an output terminal to which the high voltage is applied. The output terminal is connected to the container 24 via a feedthrough 52 penetrating the enclosure 2 and a feedthrough 53 penetrating the chamber body 14. The feedthroughs 52 and 53 are configured to be made from electrically insulating materials. The feedthrough 53 also maintains a reduced-pressure atmosphere in the vacuum chamber 3. The controller 7 regulates the potential difference (applied voltage V) between the plasma raw material 23 and the electric field applying section 50 by controlling the external voltage source 51.

Applying Electric Field to Plasma Generation Area

Figure 3:
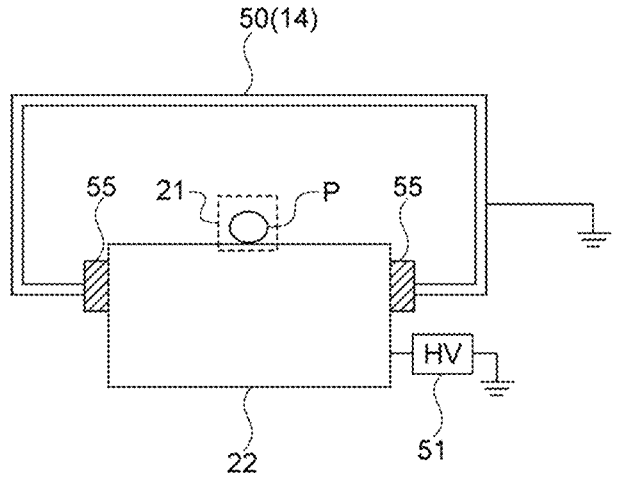
FIG. 3 is a schematic diagram illustrating a simplified model of applying an electric field to a plasma generation area.

FIG. 3 is a schematic diagram illustrating a simplified model of applying an electric field to the plasma generation area 21. As mentioned above, in the present embodiment, the chamber body 14 (vacuum chamber 3) is set as the electric field applying section 50. In other words, the components of the container (chamber body 14) that forms a vacuum atmosphere (reduced-pressure atmosphere) in the plasma generation area 21 are used as the electric field applying section 50. In the example shown in FIG. 1, the inner protrusion 16 and 17, which are provided on the inner wall of the chamber body 14 and protrude toward the plasma generation area 21, are also electrically connected to the chamber body 14 and serve as the electric field applying section 50.

FIG. 3 schematically illustrates a model in which the rotation body 22, to which the plasma raw material 23 is supplied, is connected to the chamber body 14, which serves as the electric field applying section 50, via an insulator 55. In FIG. 3, the inner protrusions 16 and 17 are omitted. Examples of the insulator 55 include the insulating foundation for mounting the container 24 in the chamber body 14, the insulating mechanical seal 42 through which the shaft 39 of the motor 38 is introduced into the chamber body 14, and the insulating seal members 49, through which the raw material inlet pipe 44 and the raw material outlet pipe 45 are introduced into the chamber body 14. In this way, providing various types of the insulators 55 between the components allows the rotation body 22 to be electrically isolated from the chamber body 14.

As shown in FIG. 3, in the present embodiment, the rotation body 22 (plasma raw material 23) is connected to the external voltage source 51 (described as HV in FIG. 3), and the chamber body 14 is connected to the GND potential. For example, when the external voltage source 51 outputs a positive high voltage (+HV) with respect to the GND potential, the plasma raw material 23 that has been supplied to the rotation body 22 has a higher potential than the chamber body 14. Conversely, when the external voltage source 51 outputs a negative high voltage (−HV) with respect to the GND potential, the plasma raw material 23 that has been supplied to the rotation body 22 has a lower potential than the chamber body 14.

In this case, the plasma generation area 21 is subjected to an electrical field that corresponds to a potential difference (+HV or −HV) between the plasma raw material 23 and the chamber body 14. For example, when the voltage applied to the plasma raw material 23 is higher, the intensity of the electric field applied to the plasma generation area 21 is larger. In addition, when the distance between the plasma raw material 23 and the chamber body 14 is shorter, the intensity of the electric field applied to the plasma generation area 21 is larger. For example, protruding the inner protrusion 16 (or inner protrusion 17), which is electrically connected to the chamber body 14, toward the plasma generation area 21, can increase the intensity of the electric field.

This configuration, in which the plasma raw material 23 is subject to a high voltage and the chamber body 14 is connected to the GND potential, eliminates the need for electrically isolating the chamber body 14 from the enclosure 2 and the like. Moreover, there is no risk of an electric shock even if a worker or other person directly touches the chamber body 14 or the enclosure 2, thereby enabling a safe apparatus. Hereinafter, the function of the electric field in the plasma generation area 21 is described.

Function of Electric Field in EUV Light Source

Figure 4:
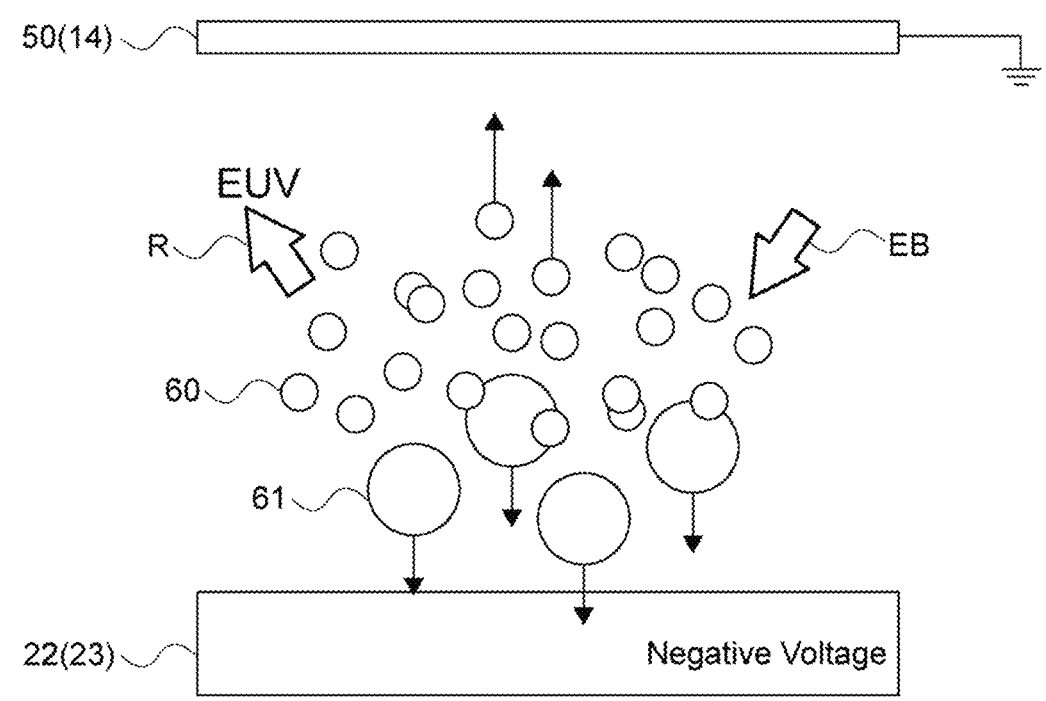
FIG. 4 is a schematic diagram illustrating the behavior of plasma when an electric field is applied to plasma generating EUV light.

FIG. 4 is a schematic diagram illustrating the behavior of plasma when an electric field is applied to the plasma emitting EUV light. With reference to FIG. 4, described below is the case in which the plasma P emitting EUV light is generated and an electric field is applied to the plasma P. In this case, examples of the plasma raw material 23 include Sn and Li, which are raw materials for EUV light emission. The intensity and wavelength (energy) of the energy beam EB are set appropriately to be capable of emitting the EUV light.

In the light source apparatus 1, irradiating the plasma raw material 23 with the energy beam EB allow atoms constituting the plasma raw material 23 to be split into negatively charged electrons 60 and positively charged ions 61 to generate the plasma P. Hence, the plasma P contains many negatively charged electrons 60 and positively charged ions 61. FIG. 4 schematically illustrates the ions 61 constituting the plasma P each indicated as a large circle, and the electrons 60 constituting the plasma P each indicated as a small circle. In addition, the rotation body 22, onto which the plasma raw material 23 is supplied and the energy beam EB is incident, and the electric field applying section 50, which is connected to the GND potential, are each schematically illustrated as a rectangular area.

When EUV light (extreme ultraviolet light) is generated as the radiation R, the electric field applying section 50 is set to a higher potential than the plasma raw material 23 that has been supplied to the rotation body 22. In this case, since the plasma raw material 23 has a lower potential, the positively charged ions 61 are attracted in the vicinity of the plasma raw material 23. This makes it possible to increase the luminous efficiency of EUV light. Hereinafter, the function of the electric field in the plasma P that generates EUV light will be specifically described. Here, the case in which Sn is used as the plasma raw material 23 and a laser beam is used as the energy beam EB will be taken as an example; however, other plasma raw materials or energy beams may be used.

As shown in FIG. 4, liquid tin (Sn) that has been supplied to the rotation body 22 as a target is irradiated with laser light (laser beam) as the energy beam EB. The radiated laser beam vaporizes the plasma raw material 23. The vaporized plasma raw material 23 is further irradiated with the laser beam to ionize the plasma raw material 23 (transform into plasma), thereby generating the plasma P containing the positively charged ions 61 (Sn+) and the negatively charged electrons 60 (e−). The plasma P is a laser-generated plasma generated by the irradiation of a laser beam.

In this process, the volume of plasma P increases due to adiabatic expansion. The expansion rate of the plasma P is proportional to, for example, the electron temperature Te and the ion temperature Ti. It is noted that while the volume of plasma P increases, its density decreases.

In FIG. 4, the plasma raw material 23, which is the target, is set to a lower potential than the electric field applying section 50, and an electric field is applied to the plasma P (plasma generation area 21). Here, the potential of the electric field applying section 50 (chamber body 14, etc.) is set to the GND potential. The potential of the plasma raw material 23 that has been supplied to the rotation body 22 is set to a negative potential. Specifically, the external voltage source 51 supplies the container 24 with a negative high voltage (−HV). Then, the potential of the plasma raw material 23 and the rotation body 22 is set to −HV via the container 24.

In order to generate EUV light, for example, it is important to maintain the plasma P in the state of a high-temperature plasma capable of emitting EUV light. In contrast, expanding the plasma P as described above decreases the temperature of the plasma P, thus it is difficult to maintain the plasma P in the state of a high-temperature plasma. The expansion of the plasma P may cause a decrease in the brightness (luminous intensity) of the EUV light.

Hence, in FIG. 4, the plasma raw material 23 is subjected to a negative applied voltage V=−HV while the chamber body 14 is set to the GND potential. This generates an electric field in the plasma generation area 21, which causes the positively charged ions 61 (Sn+) to move toward the plasma raw material 23 (rotation body 22). The ions 61 (Sn+) constituting the plasma P are attracted toward the rotation body 22, thus the ion density increases in the vicinity of the rotation body 22. In other words, the electric field generated in the plasma generation area 21 can be considered to confine the ions 61 (Sn+). This suppresses the expansion of the plasma, thereby maintaining the state of a high-temperature plasma. Therefore, this improves the brightness of the EUV light radiated from the plasma P, compared to the case in which, for example, no voltage V is applied to the plasma raw material 23.

In addition, the effect of confining the ions 61 in the plasma P due to the application of an electric field suppresses the expansion rate of the plasma P, i.e., the cooling rate of the plasma P. This makes it possible to maintain the state of the ion density optimal for EUV light emission longer than the case in which no electric field is applied. In other words, the time during which EUV light can be emitted can be extended. This makes it possible to improve the luminous efficiency (e.g., the amount of light emitted per unit time) of EUV light.

Thus, when the light source apparatus 1 is configured as an EUV light source, the plasma raw material 23, which is the target, is preferably set to a negative potential. This suppresses the expansion of the plasma P and improves the brightness and luminous efficiency of EUV light. Such a configuration is useful, for example, for increasing brightness in an inspection light source using EUV light.

Function of Electric Field in Hard X-Ray Sources

Figure 5:
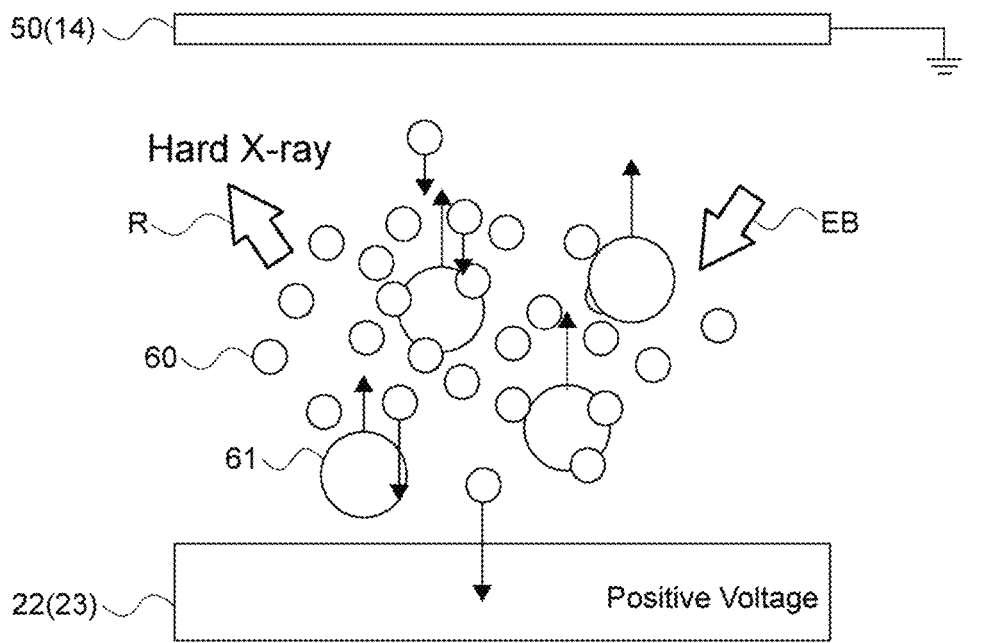
FIG. 5 is a schematic diagram illustrating the behavior of plasma when an electric field is applied to plasma generating hard X-rays.

FIG. 5 is a schematic diagram illustrating the behavior of plasma when an electric field is applied to plasma generating hard X-rays. Hereinafter, with reference to FIG. 5, described is a case in which the plasma P generating hard X-rays is generated and is subjected to an electric field. In this case, examples of the plasma raw material 23 include Ga, In, Sn, and gallium alloys, which are used as X-ray raw materials. In addition, the intensity and wavelength (energy) of the energy beam EB are set appropriately to be capable of generating hard X-rays.

When hard X-rays are generated as the radiation R, the electric field applying section 50 is set to a lower potential than the plasma raw material 23 that has been supplied to the rotation body 22. In this case, since the plasma raw material 23 has a higher potential, the negatively charged electrons 60 are attracted in the vicinity of the plasma raw material 23. This makes it possible to increase the luminous efficiency of hard X-rays. Hereinafter, the function of the electric field in the plasma P that generates hard X-rays will be specifically described. Here, the case in which Sn is used as the plasma raw material 23 and a laser beam is used as the energy beam EB will be taken as an example; however, other plasma raw materials or energy beams may be used.

As shown in FIG. 5, liquid tin (Sn) that has been supplied to the rotation body 22 as the target is irradiated with laser light (laser beam) as the energy beam EB, thereby generating the plasma P containing the positively charged ions 61 (Sn+) and the negatively charged electrons 60 (e−). The plasma P is a laser-generated plasma generated by the irradiation of a laser beam.

Here, the process of generating hard X-rays will be described. The EUV light described above is mainly generated by the transition of electrons in the outer orbits of the target material. In contrast, hard X-rays are characteristic X-rays in the form of a line spectrum generated by the excitation (inner-shell excitation) of electrons in the inner orbits of the target material.

In order to obtain such characteristic X-rays, it is necessary to excite an inner shell (e.g., K-shell) in atoms of the target material. In the inner-shell excitation, electrons in the K-shell, for example, are bounced off to generate an empty orbit. The transition of outer-shell electrons toward this empty orbit enables the emission of characteristic X-rays having an energy equal to the energy difference between the electron orbits. The wavelength of the characteristic X-rays depends on the type of atoms in the target material.

The inner-shell excitation is caused by electrons in a high-temperature plasma. In other words, the electrons in the high-temperature plasma bounce off the electrons in the inner shell, resulting in the generation of empty orbits. In order to generate such electrons in the plasma P, it is necessary to irradiate the target material with the energy beam EB (laser beam) having high intensity. The target material is biased to enhance this effect.

In FIG. 5, the plasma raw material 23, which is the target, is set to a higher potential than the electric field applying section 50, and the plasma P (plasma generation area 21) is subjected to an electric field. Here, the potential of the electric field applying section 50 (chamber body 14, etc.) is set to the GND potential. The potential of the plasma raw material 23 that has been supplied to the rotation body 22 is set to a positive potential. Specifically, a positive high voltage (+HV) is supplied to the container 24 from the external voltage source 51. Then, the potential of the plasma raw material 23 and the rotation body 22 is set to +HV via the container 24.

As a result, the electrons 60 (e−) in the plasma P are accelerated toward the rotation body 22. Hence, the plasma raw material 23 (Sn) and its ions 61 (Sn+) collide with the electrons 60 (e−) having increased momentum. As a result, the inner-shell excitation and the outer-shell electron transition occur more effectively. In other words, this method increases the utilization efficiency of the electrons 60 (e–), thereby improving the generation efficiency of characteristic X-rays.

In this way, when the light source apparatus 1 is configured as a hard X-ray light source, the plasma raw material 23, which is the target, is preferably set to a positive potential. This enables the electrons 60 in the plasma P to accelerate to efficiently cause the inner-shell excitation, thereby improving the generation efficiency (brightness) of hard X-rays.

Control of Radiation by Electric Field

In the present embodiment, the radiation diagnosis section 29 described with reference to FIG. 1 measures the intensity of radiation R (EUV light or hard X-rays). Then, the controller 7 controls the potential difference between the plasma raw material 23 and the electric field applying section 50 to increase the intensity of radiation R based on the measurement results of the intensity of radiation R. In other words, the intensity of radiation R is monitored to set the potential difference in a manner that the intensity is increased. This makes it possible to improve the luminous efficiency of the desired radiation R.

In the example shown in FIG. 1, the applied voltage V (+HV or –HV) output from the external voltage source 51 is the potential difference between the plasma raw material 23 and the electric field applying section 50. The controller 7 controls the intensity of the electric field applied to the plasma generation area 21 by controlling the magnitude of this applied voltage V. For example, the radiation diagnosis section 29 detects the spectrum of radiation R emitted from the plasma P. The controller 7 monitors the spectrum results and adjusts the applied voltage V to increase the intensity of the desired wavelength. This makes it possible to sufficiently increase the luminous efficiency of the radiation R The wavelength of radiation R can be controlled relatively easily by adjusting the intensity of the electric field while the radiation diagnosis section 29 monitors the wavelength of radiation R. In other words, the wavelength of radiation R may be controlled by controlling the applied voltage V. For example, the spectrum of radiation R may vary in response to the applied voltage V, thus the central wavelength of radiation R may shift. In this case, the applied voltage can be adjusted such that the central wavelength becomes a predetermined wavelength. This makes it possible to, for example, stabilize or fine-tune the central wavelength.

As described above, in the light source apparatus 1 according to the present embodiment, the plasma raw material 23 is supplied to the rotation body 22, which is disposed at the position onto which the energy beam EB is incident. This plasma raw material 23 is transformed into plasma by the irradiation of the energy beam EB. The plasma generation area 21 at which the plasma P is generated is subjected to an electric field via the electric field applying section 50 that is set to a potential different from that of the plasma raw material 23. This makes it possible to change the state of the plasma P, improving the luminous efficiency of the plasma P generated by the energy beam EB.

When plasma raw materials are transformed into plasma by the energy beam EB, the method of changing the state of plasma P includes changing the intensity (power) of the energy beam EB. For example, when the energy beam EB is a laser beam, a pulsed laser beam such as a YAG laser having a large peak power is employed. For example, irradiating a plasma raw material with a pulsed laser beam having high intensity can generate a high-temperature plasma having high luminous efficiency, but on the other hand, the laser source emitting the pulsed laser beam may become larger.

In the present embodiment, the plasma P is generated by irradiating the plasma raw material 23 as the target with the energy beam EB. In order to make this plasma P emit the radiation R (X-rays or EUV light), the potential between the plasma raw material 23 and the electric field applying section 50 (chamber body 14, etc.) is controlled to apply an electric field to the plasma generation area 21. This makes it possible to change the state of the plasma P.

For example, in generating EUV light as described with reference to FIG. 4, the target (plasma raw material 23) is set to a negative potential with respect to the chamber body 14, which is of the ground potential. This allows the positively charged ions 61 to be confined, thus suppressing the expansion of the plasma P and appropriately maintaining the state of the high-temperature plasma. This results in improving the luminous efficiency of EUV light in the plasma P.

Also, for example, in generating hard X-rays as described with reference to FIG. 5, the target (plasma raw material 23) is set to a positive potential with respect to the chamber body 14, which is of the ground potential. This allows the electrons 60 in the plasma P to be accelerated toward the target. The increase in the number of the electrons 60 having a high kinetic energy causes the frequency of inner-shell excitation that produces hard X-rays to increase. This results in improving the luminous efficiency of hard X-rays in the plasma P.

Second Embodiment

A light source apparatus according to a second embodiment of the present invention will be described. In the following description, the description will be omitted or simplified for the parts similar to the configuration and effect of the light source apparatus 1 described in the above embodiment.

Figure 6:
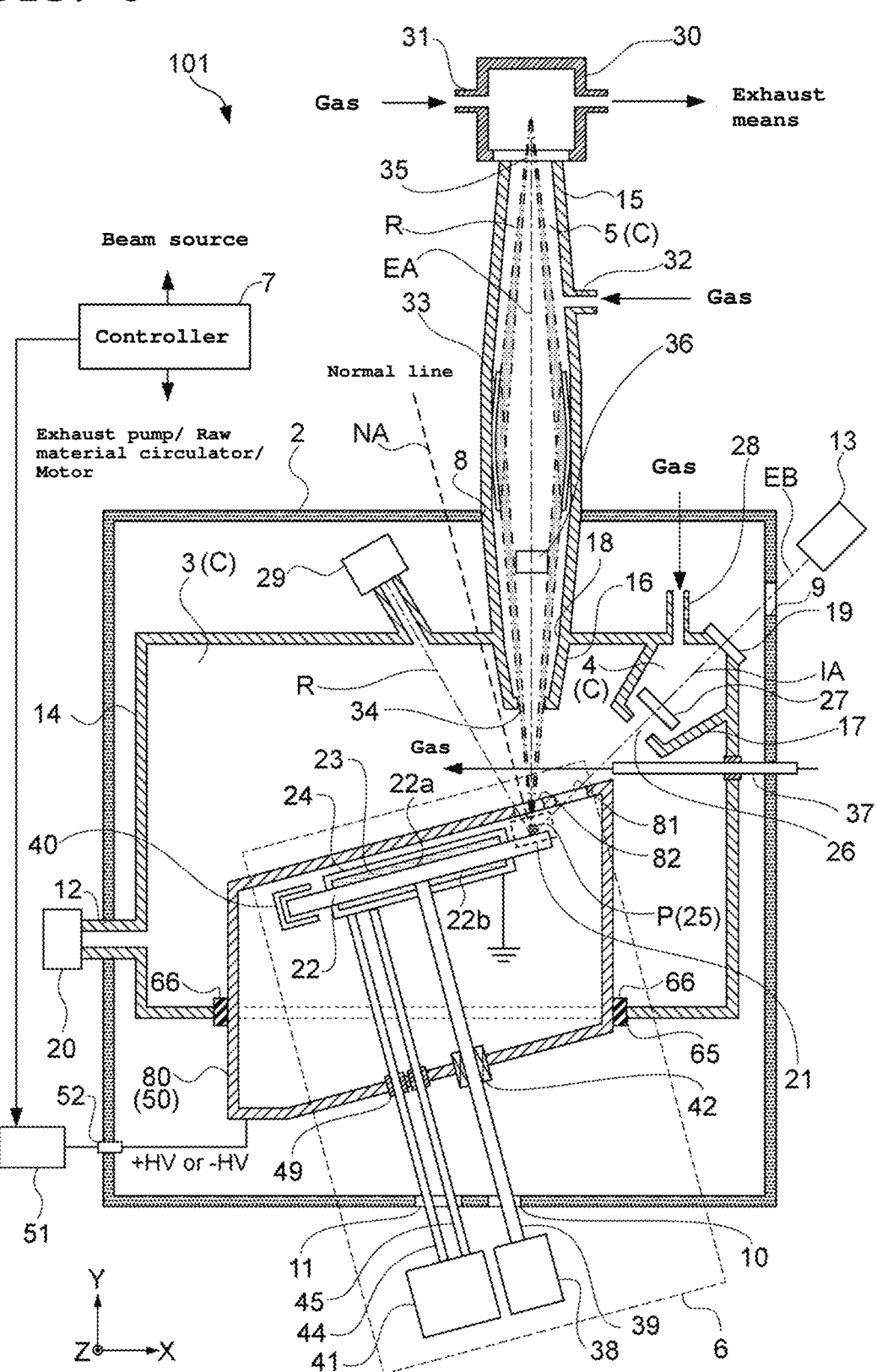
FIG. 6 is a schematic diagram illustrating a configuration example of a light source apparatus according to a second embodiment.

FIG. 6 is a schematic diagram illustrating a configuration example of a light source apparatus according to the second embodiment. A light source apparatus 101 includes the chamber body 14 provided with a rotation body accommodation chamber 80. Hereinafter, the configuration similar to that of the light source apparatus 1 described with reference to FIG. 1 will be described using the same symbols as those in FIG. 1.

The rotation body accommodation chamber 80 is at least partially provided inside the chamber body 14 and accommodates the rotation body 22. In the example shown in FIG. 6, the rotation body accommodation chamber 80 is configured such that a portion thereof protrudes from the chamber body 14 (vacuum chamber 3). The rotation body accommodation chamber 80 may be completely enclosed inside the chamber body 14. The rotation body accommodation chamber 80 is configured to accommodate the rotation body 22, the container 24, part of the shaft 39, and the skimmer 40 provided in the raw material supply mechanism 6.

In the example shown in FIG. 6, the rotation body accommodation chamber 80 is a box-shaped container in a manner that its cross-section has a parallelogram, and is fitted into an opening 65 that is provided in the rear face of the chamber body 14. The rotation body accommodation chamber 80 has a front face that is located parallel to the rotation body 22, and has a rear face and a portion of the left side face thereof protruding from the chamber body 14. This protrusion serves as a partition wall for maintaining a reduced-pressure atmosphere together with the chamber body 14.

The rotation body accommodation chamber 80 includes an energy beam opening 81 and a radiation opening 82. The energy beam opening 81 is a through-hole through which the incident axis IA of the energy beam EB passes. The radiation opening 82 is a through-hole through which the emission axis EA of the radiation R and the emission axis to the radiation diagnosis section 29 pass. The plasma generation area 21 of the rotation body 22 is irradiated with the energy beam EB through the energy beam opening 81. The radiation R (X-rays or EUV light), which has been emitted from a high-temperature plasma generated by the irradiation of the energy beam EB, is emitted through the radiation opening 82 to be incident onto the emission chamber 5 and the radiation diagnosis section 29. The interior of the chamber body 14 is spatially communicated with the interior of the rotation body accommodation chamber 80 via the energy beam opening 81 and the radiation opening 82. Hence, the interiors of both of the chambers are maintained in a reduced-pressure atmosphere.

In the present embodiment, the rotation body accommodation chamber 80 is used as the electric field applying section 50. In other words, the rotation body accommodation chamber 80 is a component that is set to a different potential than the plasma raw material 23 that has been supplied to the rotation body 22 in order to apply an electric field to the plasma generation area 21. In FIG. 6, the output terminal of the external voltage source 51 disposed outside the enclosure 2 is connected to the rotation body accommodation chamber 80 via the feedthrough 52 penetrating the enclosure 2. The rotation body accommodation chamber 80 is then subjected to a positive high voltage (+HV) or a negative high voltage (−HV) by the external voltage source 51. The operation of the external voltage source 51 is controlled by the controller 7.

Meanwhile, the contents accommodated in the rotation body accommodation chamber 80 (the rotation body 22, the container 24, the plasma raw material 23 accommodated by the container 24, part of the shaft 39, etc.), the chamber body 14, and other components inside the chamber body 14 are connected to the GND potential. In other words, each of the components is configured in a manner that only the rotation body accommodation chamber 80 is subjected to a high voltage.

Hence, in the present embodiment, the rotation body accommodation chamber 80 is insulated from the chamber body 14. Specifically, the opening 65 in the chamber body 14 is provided with an insulating member 66 that electrically isolates the rotation body accommodation chamber 80 from the chamber body 14. The insulating member 66 is made from an electrically insulating material such as ceramics. The insulating member 66 also allows the rotation body accommodation chamber 80 to penetrate from the outside to the inside of the chamber body 14 while maintaining a reduced-pressure atmosphere in the chamber body 14 and the rotation body accommodation chamber 80.

The container 24 is disposed in the rotation body accommodation chamber 80 via an electrically insulating base or the like. The shaft 39 of the motor 38 is disposed to penetrate the rotation body accommodation chamber 80. At this penetration portion, the electrically insulating mechanical seal 42 is used to allow the shaft 39 to rotate while maintaining a reduced-pressure atmosphere in the rotation body accommodation chamber 80. In addition, the raw material inlet pipe 44 and the raw material outlet pipe 45, which extends from the plasma raw material circulator 41 to the container 24, are disposed to penetrate the rotation body accommodation chamber 80. At theses penetration portions, the electrically insulating seal members 49 are used to maintain a reduced-pressure atmosphere in the rotation body accommodation chamber 80. This configuration enables the rotation body accommodation chamber 80 to be electrically insulated from the chamber body 14, other components within the chamber body 14, and the contents of the rotation body accommodation chamber 80.

Figure 7:
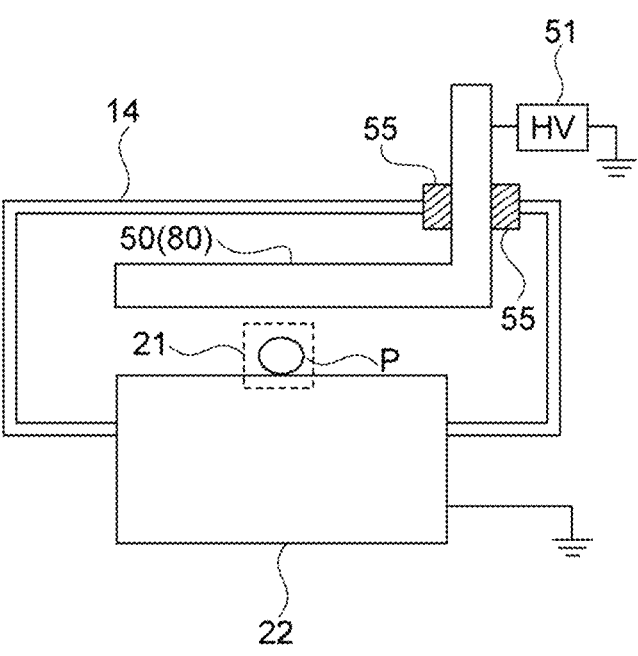
FIG. 7 is a schematic diagram illustrating a simplified model of applying an electric field to a plasma generation area.

FIG. 7 is a schematic diagram illustrating a simplified model of applying an electric field to the plasma generation area 21. As described above, in the present embodiment, the rotation body accommodation chamber 80 provided in the chamber body 14 is set as the electric field applying section 50. In other words, the component provided separately from the chamber body 14 is used as the electric field applying section 50.

FIG. 7 schematically illustrates a model in which the member that serves as the electric field applying section 50 is introduced into the chamber body 14 via the insulator 55. In this model, the rotation body 22 is electrically connected to the chamber body 14. Examples of the insulator 55 include the insulating base for mounting the container 24 in the rotation body accommodation chamber 80, the insulating mechanical seal 42 through which the shaft 39 of the motor 38 is introduced into the rotation body accommodation chamber 80, and the insulating seal members 49 through which the raw material inlet pipe 44 and the raw material outlet pipe 45 are introduced into the chamber body 14. Providing various types of the insulators 55 between the components allows the rotation body accommodation chamber 80 to be electrically isolated from the other components.

As shown in FIG. 7, in the present embodiment, the rotation body accommodation chamber 80 is connected to the external voltage source 51 (shown in FIG. 3 as HV), and the rotation body 22 and the chamber body 14 are connected to the GND potential. For example, when a positive high voltage (+HV) is output from the external voltage source 51 in reference to the GND potential, the rotation body accommodation chamber 80 has a higher potential than the plasma raw material 23 that has been supplied to the rotation body 22. Conversely, when a negative high voltage (−HV) is output from the external voltage source 51 in reference to the GND potential, the rotation body accommodation chamber 80 has a lower potential than the plasma raw material 23 that has been supplied to the rotation body 22.

In this case, the plasma generation area 21 is subject to an electric field corresponding to a potential difference (+HV or −HV) between the plasma raw material 23 and the rotation body accommodation chamber 80. This configuration allows the distance between the plasma raw material 23 and the rotation body accommodation chamber 80, which serves as the electric field applying section 50, to be set relatively short. Hence, this configuration can increase the intensity of the electric field applied to the plasma generation area 21, compared to the configuration in which the chamber body 14 is used as the electric field applying section 50 as shown in FIG. 1, for example.

In addition, the configuration, in which the rotation body accommodation chamber 80 is subject to a high voltage and the rotation body 22 and the chamber body 14 are connected to the GND potential, eliminates the need for electrically isolating the rotation body 22 and the chamber body 14 from the enclosure 2 and the like. Since the motor 38 and the plasma raw material circulator 41 are also at the GND potential, this makes it possible to safely handle the apparatus.

The case of generating EUV light in the light source apparatus 101 shown in FIG. 6 will be described. When generating EUV light as described above, the plasma raw material 23, which is the target, is preferably at a low potential with respect to the electric field applying section 50 (see FIG. 4). In this case, the rotation body accommodation chamber 80, which serves as the electric field applying section 50, is subject to a positive applied voltage V (V=+ HV) supplied from the external voltage source 51. As a result, when the plasma P is generated by the irradiation with the energy beam EB, the positively charged ions 61 (e.g., Sn+, etc.) contained in the plasma P are confined in the vicinity of the rotation body 22. This suppresses the expansion of the plasma P and appropriately maintains the state of the high-temperature plasma. This results in improving the luminous efficiency of EUV light in the plasma P.

The case of generating hard X-rays in the light source apparatus 101 shown in FIG. 6 will be described. When generating hard X-rays as described above, the plasma raw material 23, which is the target, is preferably at a higher potential than the electric field applying section 50 (see FIG. 5). In this case, the rotation body accommodation chamber 80, which serves as the electric field applying section 50, is subject to a negative applied voltage V (V=−HV) supplied from the external voltage source 51. As a result, when the plasma P is generated by the irradiation with the energy beam EB, the negatively charged electrons 60 contained in the plasma P are accelerated toward the rotation body 22. This increases the number of electrons 60 having a high kinetic energy, increasing the frequency of inner-shell excitation that produces hard X-rays. This results in improving the luminous efficiency of hard X-rays in the plasma P.

In the above as shown in FIG. 6, described is the configuration in which the rotation body accommodation chamber 80 is disposed to penetrate the chamber body 14. For example, the rotation body accommodation chamber 80 may be configured to be accommodated inside the chamber body 14. In this case, the rotation body accommodation chamber 80 is provided with through-holes through which the respective components of the shaft 39, the raw material inlet pipe 44, and the raw material outlet pipe 45 are guided in a manner to avoid being in contact with the rotation body accommodation chamber 80. In addition, the chamber body 14 is also provided with the mechanical seal 42 through which the shaft 39 is guided, and the seal members 49 through which the raw material inlet pipe 44 and the raw material outlet pipe 45 are guided. It is noted that the mechanical seal 42 and the seal members 49 are not necessarily made from an electrically insulating material in this configuration.

In addition, a rod-shaped or plate-shaped electrode member may be used as the electric field applying section 50 instead of the rotation body accommodation chamber 80. For example, as shown in the model in FIG. 7, a metal member insulated from the members including the chamber body 14 that are connected to the GND potential is disposed at a position facing the front surface 22a of the rotation body 22 and across the plasma generation area 21. Even this configuration can apply an electric field to the plasma generation area 21 as necessary.

Other Embodiments

The present invention is not limited to the embodiments described above, and can be achieved in various other embodiments.

The above describes an example in which the chamber body 14 is electrically connected to the inner protrusions 16 and 17, which are disposed inside the chamber body 14 and protrude toward the plasma generation area 21. For example, the inner protrusion 16 (or inner protrusion 17) may be insulated from the chamber body 14 and used as the electric field applying section 50. In other words, the protrusion (inner protrusions 16 and 17) that protrudes toward the plasma generation area may be used as the electric field applying section 50. Such a configuration in which the inner protrusion 16 (or inner protrusion 17) is used as the electric field applying section 50 can be represented by the model shown in FIG. 7, for example.

For example, the inner protrusion 16, which constitutes the emission chamber 5 of the radiation R, is electrically insulated from the chamber body 14 by an insulator (not shown) made of ceramic material or the like. The inner protrusion 16 is connected to the output terminal of the external voltage source 51. The chamber body 14 and the rotation body 22 (plasma raw material 23) are connected to the GND potential. In this case, applying a positive voltage (+HV) to the inner protrusion 16 makes it possible to improve the luminous efficiency of EUV light. Alternatively, applying a negative voltage (−HV) to the inner protrusion 16 makes it possible to improve the luminous efficiency of hard X-rays.

Applying a voltage to the inner protrusion 16 generates the electric field, which in turn can repel ionic debris from the inner protrusion 16 and divert the travelling direction of the debris away from the direction of entering the emission chamber 5. These effects are also effective even when a component other than the inner protrusion 16 is used as the electric field applying section 50. For example, in FIG. 1, the chamber body 14, which serves as the electric field applying section 50, is connected to the GND potential. In this configuration, the inner protrusion 16 is insulated from the chamber body 14. Then, a new external voltage source provided to control debris is connected to the inner protrusion 16. This makes it possible to suppress debris or the like from entering the emission chamber 5.

Similarly, the inner protrusion 17, which constitutes the incident chamber 4 of the energy beam EB, may be electrically insulated from the chamber body 14 by an insulator (not shown) made of ceramic material or the like. In this case, applying a high voltage to the inner protrusion 17 appropriately makes it possible to improve the luminous efficiency of the radiation R.

In the present disclosure, words such as "about", "nearly", and "approximately" are suitably used to readily understand the explanation. On the other hand, there is no clear difference between the cases in which these words "about", "nearly", and "approximately" are used and the cases in which they are not used. In other words, in the present disclosure, concepts that define shape, size, position relationship, and state, such as "center", "middle", "uniform", "equal", "same", "orthogonal", "parallel", "symmetrical", "extending", "axial direction", "cylindrical shape", "cylindrical hollow shape", "ring shape", and "annular shape", are concepts including "substantially center", "substantially middle", "substantially uniform", "substantially equal", "substantially same", "substantially orthogonal", "substantially parallel", "substantially symmetrical", "substantially extending", "substantially axial direction", "substantially cylindrical shape", "substantially cylindrical hollow shape", "substantially ring shape", and "substantially annular shape". The concepts also include concepts having states in a predetermined range (e.g., ±10% range) with respect to, for example, "exactly center", "exactly middle", "exactly uniform", "exactly equal", "exactly same", "exactly orthogonal", "exactly parallel", "exactly symmetrical", "exactly extending", "exactly axial direction", "exactly cylindrical shape", "exactly cylindrical hollow shape", "exactly ring shape", "exactly annular shape", and the like. Hence, even when the words such as "about", "nearly", and "approximately" are not added, the concepts may include those that are expressed by adding "about", "nearly", "approximately", and the like. Conversely, states expressed by adding "about", "nearly", "approximately", and the like do not necessarily exclude their exact states.

In the present disclosure, expressions using the term "than" such as "greater than A" and "less than A" are expressions that comprehensively include concepts that include the case that is equal to A and concepts that do not include the case that is equal to A. For example, "greater than A" is not limited to the case where it does not include "equal to A"; however, it also includes "equal to or greater than A". Also, "less than A" is not limited to "less than A"; it also includes "equal to or less than A". Upon the implementation of the present technology, specific settings and other settings are suitably adopted from the concepts that are included in "greater than A" and "less than A" to achieve the effects described above.

Among the characteristic portions according to the present technology described above, it is also possible to combine at least two of the characteristic portions. In other words, the various characteristic portions described in each embodiment may be optionally combined without being restricted to the embodiments. The various effects described above are merely examples and are not limitative; other effects may also be achieved.

What is claimed is:

1. A light source apparatus, in which an energy beam transforms a liquid raw material into plasma via a Laser Produced Plasma (LPP) method to extract radiation, the light source apparatus comprising:

a rotation body including a plasma generation area onto which the energy beam is incident;

a raw material supply section connected to the rotation body for supplying the liquid raw material to the rotation body; and an electric field applying section including a first element that is electrically grounded and a second element located near the first element and connected to an external voltage source, the electric field applying section setting a first potential different from a second potential of the liquid raw material that has been supplied to the rotation body by applying an electric field to the plasma generation area in which plasma is to be generated by irradiation of the energy beam.

2. The light source apparatus according to claim 1, wherein the electric field applying section includes a conductor connected to the external voltage source and disposed at a position facing the rotation body and across the plasma generation area.

3. The light source apparatus according to claim 2, wherein the rotation body is a disk-shaped member having a front surface and a back surface, and is disposed to allow the energy beam to be incident on the front surface, and the electric field applying section is disposed at a position opposite the front surface of the rotation body.

4. The light source apparatus according to claim 1, further comprising a chamber section, the chamber section including a plasma generation section that accommodates the rotation body and forms the plasma generation area, a beam introduction section that introduces the energy beam into the plasma generation area, and a radiation extraction section that extracts the radiation from the plasma that has been generated in the plasma generation area.

5. The light source apparatus according to claim 4, wherein the electric field applying section includes at least one of the plasma generation section, the beam introduction section, or the radiation extraction section.

6. The light source apparatus according to claim 4, wherein the chamber section includes a protrusion that protrudes toward the plasma generation area, and the electric field applying section includes the protrusion.

7. The light source apparatus according to claim 4, wherein the chamber section includes a chamber body to which the beam introduction section and the radiation extraction section are connected, and a rotation body accommodation chamber that is at least partially provided inside the chamber body and that accommodates the rotation body, and the electric field applying section includes the rotation body accommodation chamber connected to the external voltage source while the rotation body is electrically grounded.

8. The light source apparatus according to claim 7, wherein the rotation body accommodation chamber is insulated from the chamber body.

9. The light source apparatus according to claim 1, wherein the radiation includes X-rays or extreme ultraviolet light.

10. The light source apparatus according to claim 1, wherein the radiation includes extreme ultraviolet light, and the electric field applying section is set to a higher potential than the liquid raw material that has been supplied to the rotation body.

11. The light source apparatus according to claim 10, wherein the second potential of the liquid raw material is set to a negative potential, and the first potential of the electric field applying section is set to a ground potential.

12. The light source apparatus according to claim 1, wherein the radiation includes hard X-rays, and the electric field applying section is set to a lower potential than the liquid raw material that has been supplied to the rotation body.

13. The light source apparatus according to claim 12, wherein the second potential of the liquid raw material is set to a positive potential, and the first potential of the electric field applying section is set to a ground potential.

14. The light source apparatus according to claim 1, further comprising: a radiation measurement section that measures a state of the radiation from the plasma; and a potential control section that controls a potential difference between the liquid raw material and the electric field applying section based on a measurement result of the state of the radiation.

15. The light source apparatus according to claim 14, wherein the radiation measurement section measures intensity of the radiation, and the potential control section controls the potential difference between the liquid raw material and the electric field applying section such that the intensity of the radiation is increased based on a measurement result of the intensity of the radiation.

16. The light source apparatus according to claim 1, wherein the energy beam includes a laser beam.

17. A light source apparatus for extracting radiation by transforming a liquid raw material into plasma, comprising:

an energy beam source for emitting energy beam;

a rotation body electrically grounded and including a plasma generation area where the liquid raw material and the energy beam are received for generating plasma; and an electric field applying section including a conductor connected to an external voltage source and located over the rotation body and across the plasma generation area for setting a first potential different from a second potential of the liquid raw material by applying an electric field to the plasma generation area while the energy beam is emitted so as to improve lumen efficiency of the plasma.

18. A light source apparatus for extracting radiation by transforming a liquid raw material into plasma, comprising:

an energy beam source for emitting energy beam;

a rotation body including a plasma generation area where liquid raw material and the energy beam are received for generating plasma;

a raw material supply section connected to the rotation body for supplying the liquid raw material to the plasma generation area on the rotation body;

a chamber body for housing the rotation body within the chamber body;

an external voltage source for providing a predetermined voltage; and an electric field applying section including a first element that is electrically grounded and a second element located near the first element and connected to the external voltage source, the electric field applying section for setting a first potential different from a second potential of the liquid raw material by applying an electric field to the plasma generation area while the energy beam is emitted so as to improve lumen efficiency of the plasma.

19. The light source apparatus according to claim 18, wherein the first element is the chamber body while the second element is the rotation body.

20. The light source apparatus according to claim 18, further comprising a rotation body accommodation chamber for enclosing the rotation body at least partially within the chamber, wherein the first element is the rotation body while the second element is the rotation body accommodation chamber.

21. The light source apparatus according to claim 18, further comprising a conductor located directly over the rotation body and across the plasma generation area, wherein the first element is the rotation body while the second element is the conductor.

* * * * *